US006721040B2

(12) United States Patent
Saito et al.

(10) Patent No.: US 6,721,040 B2
(45) Date of Patent: Apr. 13, 2004

(54) EXPOSURE METHOD AND APPARATUS USING NEAR FIELD LIGHT

(75) Inventors: Kenji Saito, Tochigi (JP); Ryo Kuroda, Kanagawa (JP); Yasuhisa Inao, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 230 days.

(21) Appl. No.: 10/051,985

(22) Filed: Jan. 16, 2002

(65) Prior Publication Data

US 2002/0105628 A1 Aug. 8, 2002

(30) Foreign Application Priority Data

Jan. 26, 2001 (JP) .......................... 2001-019133

(51) Int. Cl.[7] .................. G03B 27/72; G03B 27/42; G03B 27/32
(52) U.S. Cl. .................. 355/69; 355/53; 355/77
(58) Field of Search .................. 355/69, 53, 71, 355/77; 250/548, 205, 492.2; 362/268; 356/400; 430/5

(56) References Cited

U.S. PATENT DOCUMENTS

| 5,789,734 A | 8/1998 | Torigoe et al. .......... 250/201.2 |
| 5,831,715 A | 11/1998 | Takahashi .................. 355/53 |
| 6,171,730 B1 | 1/2001 | Kuroda et al. .................. 430/5 |

FOREIGN PATENT DOCUMENTS

| JP | 6-326000 | 11/1994 |
| JP | 7-220988 | 8/1995 |
| JP | 8-179493 | 7/1996 |
| JP | 9-007935 | 1/1997 |
| JP | 11-145051 | 5/1999 |

*Primary Examiner*—Peter B. Kim
(74) *Attorney, Agent, or Firm*—Morgan & Finnegan, LLP

(57) ABSTRACT

There is provided an exposure method including the steps for arranging an object to be exposed and a transparent plate that includes a thin film, within such a range that near field light from the thin film may operate on the object, the thin film having a light transmittance that changes according to an intensity of light of incidence, and exposing the object with the near field light generated by projecting a pattern on a mask onto the thin film of the transparent plate.

34 Claims, 13 Drawing Sheets

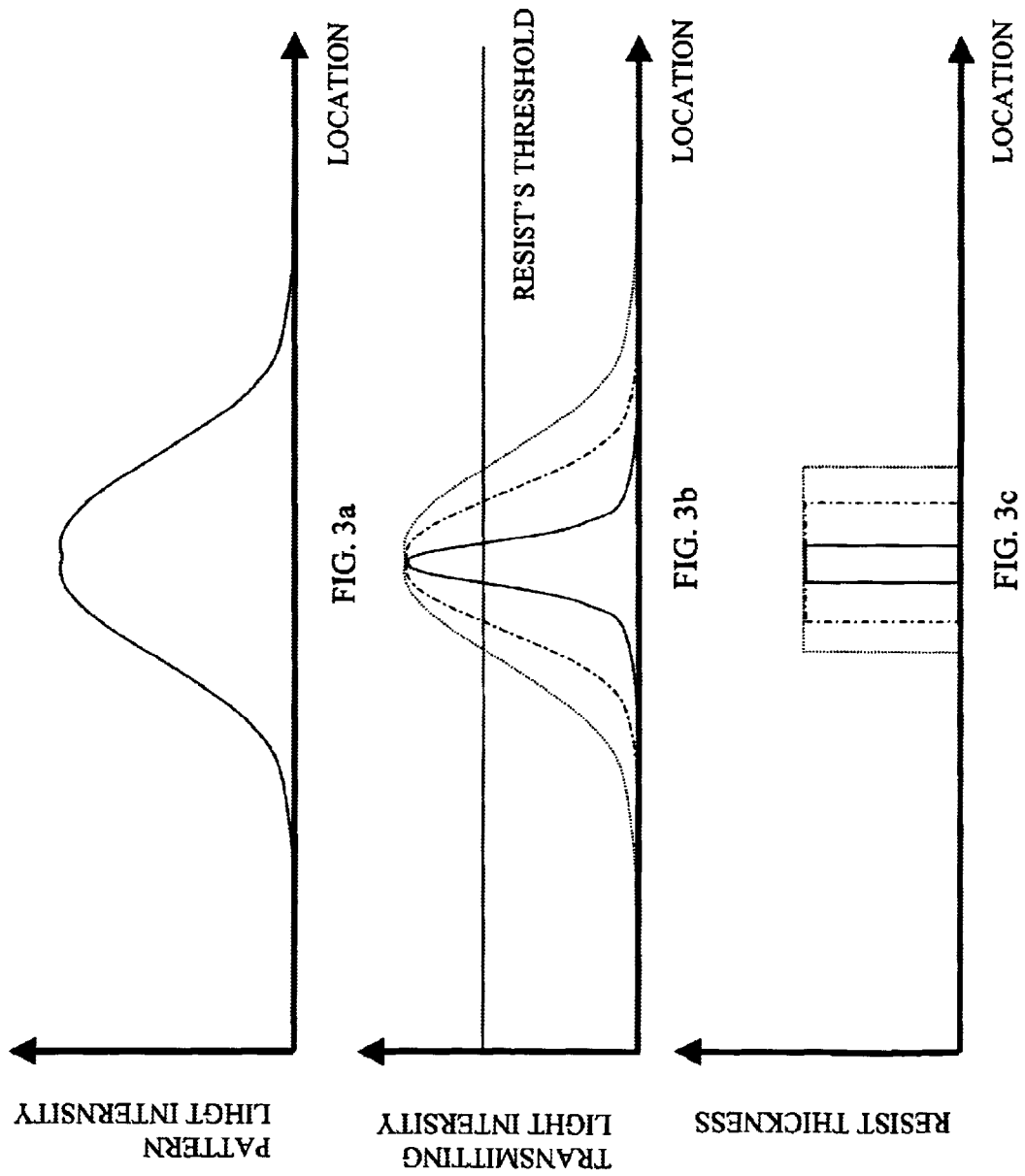

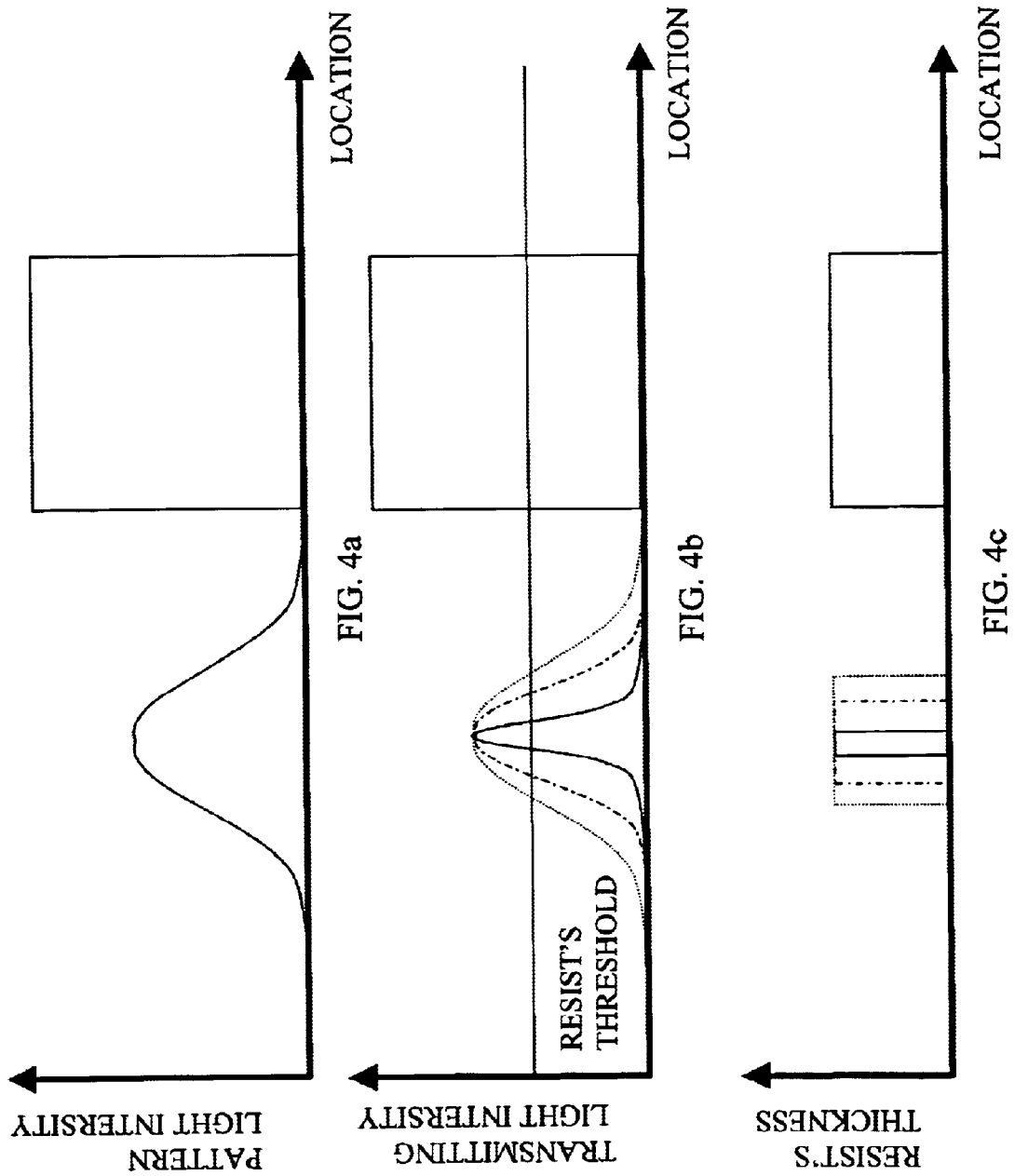

FIG. 5b
FIG. 5a

EXPOSURE METHOD AND APPARATUS USING NEAR FIELD LIGHT

BACKGROUND OF THE INVENTION

This invention relates generally to exposure apparatuses, and more particularly to an exposure method and apparatus used to expose an object to be exposed, such as a single crystal substrate for a semiconductor wafer, and a glass substrate for a liquid crystal display (LCD), a device fabricating method using the exposed object, and a device fabricated from the exposed object. The exposure method and apparatus of the instant invention are applicable to the fabrication of various types of devices, for example, semiconductor chips such as ICs and LSIs, display devices such as liquid crystal panels, detecting devices such as magnetic heads, and imaging devices like CCDs.

The conventional photolithography for fabricating devices, such as ICs, LSIs, and liquid crystal panels, has utilized projection exposure methods and apparatuses. Such methods and apparatuses use a projection optical system to project or transfer a circuit pattern on a photo-mask or reticle (called "a mask" hereinafter) onto a photoresist-applied, photosensitive substrate, such as a silicon wafer and a glass plate (called a "wafer" hereinafter), thereby exposing the substrate with the circuit pattern.

The higher integration of these devices accordingly requires a smaller pattern to be transferred to a chip area on a wafer, that is, the higher resolution, as well as a larger area for each chip area on the wafer. Therefore, the projection exposure method and apparatus for taking a lead in the fine wafer processing technology are also required to improve the resolution and exposure area so that an image with a size (or line width) of 0.5 µm or less can be formed in a wider area.

A typical schematic of a conventional projection exposure apparatus is shown in FIG. 13. In FIG. 13, 191 denotes an excimer laser as a light source for far ultraviolet exposure, 192 an illumination optical system, 193 an illumination beam, 194 a mask, 195 an object-side exposure beam emitting from the mask 194 and incident upon the optical system 196, 196 a demagnification projection optical system, 197 an image-side exposure beam emitting from the optical system 196 and incident upon the wafer 198 which is a photosensitive substrate, and 199 a substrate stage that holds the photosensitive substrate.

The laser beam emitted from the excimer laser 191 is directed to the illumination optical system 192 by a directing optical system, and then turned by the illumination optical system 192 into the illumination beam 193 with a specified light intensity distribution, a luminous intensity distribution, and an open angle (number of apertures NA). The illumination beam 193, in turn, illuminates the mask 194. The mask 194 forms on its quartz substrate a chromium pattern, which is a reciprocal times of projection optical system 196's projection power (for example, twice, four times or five times) as large as the minute pattern formed on the wafer 198. The illumination beam 193 is diffracted after transmitting through the minute pattern on the mask 194, and turned into the object-side exposure beam 195. The projection optical system 196 converts the object-side exposure beam 195 into the image-side exposure beam 197 for forming an image representative of mask 194's minute pattern on the wafer 198 with the above projection power and sufficiently small aberration. The image-side exposure beam 197 converges, as shown in the enlarged part at the bottom of FIG. 13, onto the wafer 198 with a specified NA (=sin θ), creating an image of the minute pattern on the wafer 198. In order to form a minute pattern sequentially on multiple different areas (or shot areas each of which will becomes one or more chips) on the wafer 198, the substrate stage 199 stepwise moves along the image plane of the projection optical system and shifts a position of the wafer 198 relative to the projection optical system 196.

However, it is difficult for the projection exposure apparatuses, which use currently widespread excimer lasers as a light source, to form a pattern of 0.10 µm or less.

The projection optical system 196 has its limits in resolution based on the trade-off between the optical resolution R dependent on the wavelength of an exposure beam (called an "exposure wavelength" hereinafter) and a depth of focus ("DOF"). R and DOF in the projection exposure apparatus are given as following Rayleigh's formulas (1) and (2):

$$R = k_1(\lambda/NA) \quad (1)$$

$$DOF = k_2(\lambda/NA) \quad (2)$$

λ is an exposure wavelength, NA is the number of apertures at the image side of the projection optical system 196, and values of $k_1$ and $k_2$ usually fall between about 0.5–0.7, at most about 0.4 even for a resolution enhancement like a phase shift. These formulas indicates that the superior resolution with a smaller value of R is obtainable from the higher NA or the increased number of apertures NA, but the projection optical system 196 needs relatively large DOF in the actual exposure and the NA can be increased to only some extent. As a result, it is understood that a shorter wavelength or reduced exposure wavelength λ is needed for the higher resolution.

Nevertheless, the shortened wavelength would possibly raise a critical problem in that there would be no glass materials available for lenses in the projection optical system 196. Transmittances of most glass materials are close to 0 in the far ultraviolet range. Even synthetic quartz, which is fabricated by a special fabricating method, as a glass material for an exposure apparatus (with the exposure wavelength of 248 nm), drops its transmittance drastically for the exposure wavelength of 193 nm or shorter. It seems very difficult to develop practical glass materials as have sufficiently high transmittance for an exposure wavelength of 150 nm or less, which allows for a minute pattern transfer of 0.10 µm or less. Further, glass materials for use in the far ultraviolet range need to satisfy such certain conditions in view of durability, uniform refractive index, optical distortion, and manufacturability, in addition to the transmittance, that practical glass materials for the exposure wavelength of 150 nm or shorter become harder to be available.

The conventional projection exposure method and apparatus thus need to use the shortened exposure wavelength of about 150 nm or below to form a pattern of 0.10 µm or less on the wafer 198, but cannot do that since no practical glass material is available in this wavelength range.

In the meantime, a fine processing apparatus configured as a scanning near field optical microscope (referred to as an "SNOM" hereinafter) has recently been proposed to provide optical fine processing of a size of 0.1 µm or less. This apparatus utilizes evanescent or near-field light oozed out of a fine aperture of, for example, 100 nm or less to locally expose the resist beyond the limit of a light wavelength. However, such a SNOM lithographic apparatus disadvantageously has a poor throughput since it is adapted to use one or more processing probes for the fine process as if drawing a picture with a single stroke of brush.

As in Japanese Laid-Open Patent Application No. 8-179493, one proposed solution for this problem provides a photo mask with a prism, leads light to the prism at an angle of incidence producing the total reflection, and utilizes the near field light oozed out of the total-reflection surface to transfer the entire photo mask pattern onto the resist at one time.

It is requisite for the batch exposure apparatus using the prism and near field light, as disclosed in the above reference, to set a distance between the prism/mask and the resist surface to 100 nm or less. However, in reality, it is difficult to set the distance between them to 100 nm or less throughout the entire prism/mask surface, due to the limitative surface precision and flatness of the prism/mask and the substrate. Any slight tilt in positioning the prism/mask relative to the substrate would make the distance setting difficult.

Such a non-uniform interval disadvantageously results in a non-uniformly exposed pattern, and partially crushed resist by the prism/mask.

One proposed solution for these problems provides an exposure method and exposure apparatus using evanescent light with an elastic mask having a minute aperture pattern with an aperture width of 100 nm or less on its first surface. The mask is made of elastic material and elastically transformable in the normal line direction on the mask surface. Thus, the apparatus and method exposes and transfers the minute aperture pattern onto an object to be exposed, which is arranged opposite to the front surface of the mask (Japanese Laid-Open Patent Application No. 11-145051).

Nevertheless, such exposure using a mask and near field light is still disadvantageous to practical applications in various difficulties, for example, in manufacturing a necessary minute mask of an equal magnification, and in an alignment between the near-field mask and the wafer.

On the other hand, there has been proposed a resist exposing method, which includes the steps of applying onto a resist a thin film which augments optical transmittance as the intensity of an incident beam increases, irradiating an optical spot to the thin film so as to increase the optical transmittance of the thin film locally, shaping the optical-transmittance increased part in the thin film into a desired pattern by relatively scanning the optical spot and the resist, and exposing the resist by way of the optical-transmittance increased part in the thin film (Japanese Laid-Open Patent Application No. 9-7935). This method employs an opaque thin film for the thin film having a given fusing or sublimation point, and increases the optical transmittance in the thin film by locally heating the thin film with the optical spot until the temperature exceeds the fusing or sublimation point. The thin film scanned by a laser scanning exposure apparatus heats up in a portion irradiated by the laser spot. The optical intensity distribution of the laser spot is generally in the form of a Gaussian distribution, and the temperature distribution in the thin film is approximately in the form of a Gaussian distribution accordingly. Therefore, the adjustment of the laser power would be able to raise the temperature in an area w only, which is far narrower than a laser spot $\phi$, higher than the fusing point. As the thin film in this area w melts down past its fusing point and the melted part allows a beam to pass, a linear scan of the laser spot, for example, would create a straight-line light transmitting part with a width of w, which is far thinner than the laser spot size $\phi$, on the opaque thin film. The light transmitting part thus formed on the opaque thin film may narrow its width w. In addition, when multiple straight-line light transmitting parts are formed at regular intervals, the cycle may be much smaller than the diffractive limit determined by the optical cutoff frequency. The resist is exposed by near-field light passing through the thus created minute aperture.

However, the exposure method disclosed in Japanese Laid-Open Patent Application No. 9-7935 could not stably derive its effect because the method directly applies the optical-transmittance increasing thin film onto the resist The uniform film formation has also been difficult since the conditional formation of the film onto the resist film relies upon resist's characteristics. Moreover, it is arduous to form a film for each of thousands of objects to be exposed. Further, the resist process should burdensomely strip this thin film off from the resist after exposure. As a consequence, the exposure method described in this reference has a poor throughput disadvantageously. Due to the fine uneven surfaces of the resist as well as the underlying substrate, it is also difficult to laminate or form a thin film uniformly on the resist, whereby the exposure method in this reference disadvantageously has the poor overlay accuracy for exposure.

BRIEF SUMMARY OF THE INVENTION

Accordingly, it is a general object of the present invention to provide a novel and useful exposure method and apparatus, device fabrication method, and device, in which the above disadvantages are eliminated.

More specifically, it is an exemplary object of the present invention to provide an exposure method and apparatus having an excellent throughput, overlay accuracy and resolution and device fabricating method, as well as a device.

An exposure method according to one aspect of this invention includes the steps of arranging an object to be exposed and a transparent plate that includes a thin film, within such a range that near field light from the thin film may operate on the object, the thin film having a light transmittance that changes according to an intensity of light of incidence, and exposing the object with near field light generated by projecting a pattern on a mask, onto the thin film of the transparent plate. An exposure apparatus according to another aspect of this invention includes a transparent plate, arranged within such a range that the near field light from the transparent plate may operate on an object to be exposed, said transparent plate including a thin film whose light transmittance changes according to an intensity of light of incidence, and a projection optical system for projecting a pattern on a mask onto the thin film of the transparent plate and exposing the object with near field light generated by the projection. Such an exposure method and apparatus utilize the near field light for exposure, create a thin film in the transparent plate as a member independent of the object, and use the projection optical system to project a pattern on a mask onto the thin film.

The thin film may be an optically or thermally active layer that reversibly generates a minute aperture using light or heat. It is therefore preferable that it is composed of a phase changing material or a material having a high tertiary nonlinear effect, preferably, antimony or an alloy of antimony as its main ingredient. It is desirable to additionally provide stabilizing layers that stabilize fluctuations in the light transmittance of the thin film and protect the thin film. A range in which the near field light operates on the object may be set, for example, as a separation between the thin film and the object that is from zero to a wavelength of the near field light or less. The thin film adapted such that it wholly covers the object would make it easy for the thin film and the object to contact to and exfoliate from each other.

The thin film may be so elastically transformable that it wholly or partly contacts to and exfoliates from the object. According to Pascal's principle, it is a good practice to use uniform pressure to transform the thin film such that it may contact to and exfoliate from the object.

It is preferable that such an exposure method and apparatus may perform various corrections to realize exposure of high accuracy. Such corrections may include the focus and tilt corrections for the object which optically detect the exposing position (focal position) of the object and then perform corrections based on the detected focal position, alignment of the object using an alignment mark provided on the object as well as corrections of an alignment aberration, corrections of the projection system's aberration produced due to a thickness of the transparent plate, and the like. The corrections of the projection system's aberration may be performed, for example, by changing a separation between the lenses in the projection optical system.

The device fabricating method according to still another aspect of the present invention includes the steps for utilizing the above exposure apparatus to project and expose the object, and performing a predetermined process on the object projected and exposed. The claim for the device fabricating method that expressly declares an operation similar to that of the above exposure apparatus continues to have its effect on a device as its intermediate and final product. Such devices include semiconductor chips such as LSI and VLSI, CCDs, LCD, magnetic sensors, and thin film magnetic heads.

Other objects and more characteristics of the present invention will be made clear by the preferred embodiments described referencing accompanying drawings as follows.

BRIEF DESCRIPTION OF THE DRAWINGS

FIG. 3 shows graphs showing a light intensity distribution of a transmitted light immediately after transmitting through the transparent plate shown in FIG. 1, and a thickness distribution of the resist thin film after being exposed according to the light intensity distribution.

FIG. 4 is a graph where a minute mask pattern exposed using the exposure apparatus shown in FIG. 1 and a thicker mask pattern are exposed at the same time.

FIG. 5 is an example of a dual gate pattern that includes thick and minute patterns, which is expectedly fabricated from an object to be exposed by using the exposure apparatus shown in FIG. 1.

DETAILED DESCRIPTION OF THE PREFERRED EMBODIMENTS

A description will now be given below of an exemplary exposure apparatus 1 of the present invention by referring to the accompanying drawings. Here, FIG. 1 shows a schematic illustration of the exemplary exposure apparatus 1 of the present invention on its left side, and an enlarged schematic view of a transparent plate 40 and a plate 50 on its right.

Figure 1:
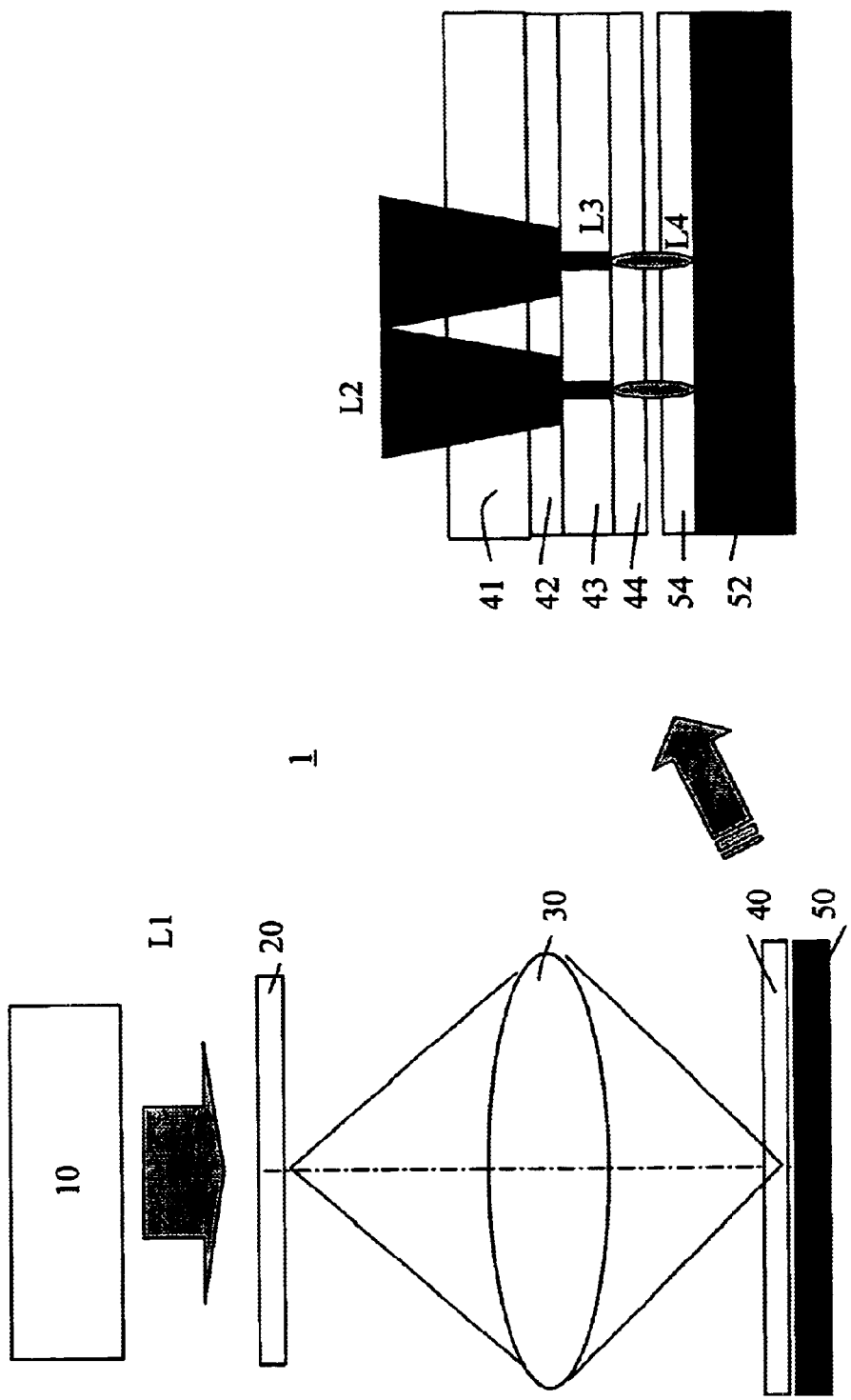
FIG. 1 is a schematic illustration of an exemplary exposure apparatus of the present invention.

As shown in FIG. 1, the exposure apparatus 1 includes a light source section 10, a reticle 20, a projection optical system 30, a transparent plate 40, and a plate 50. The exposure apparatus 1 may use a batch exposure of equal or reduced magnification, a step-and-repeat or step-and-scan method to expose a circuit pattern formed on the reticle 20 onto the plate 50. Here, the "step-and-scan method" represents an exposure method which continuously scans the plate 50 relative to the reticle 20 to expose a pattern on the reticle 20 onto the plate 50 as well as moving the plate 50 stepwise after a one-shot exposure has been completed to enter an exposure area for the next shot. On the other hand, the step-and-repeat method is an exposure method that moves the plate 50 stepwise every block exposure of a shot on the plate 50 so that the next shot moves to the exposure area.

If necessary, the light source section 10 may use an illumination light L1 via an illumination optical system to illuminate the reticle 20 on which a circuit pattern to be transferred is formed. The light source section 10 may employ a laser beam as a light source, which emits, for example, ultraviolet or soft X ray. A laser to be used is an ArF excimer laser with a wavelength of approximately 193 nm, KrF excimer laser with a wavelength of approximately 248 nm, or $F_2$ excimer laser with a wavelength of approximately 157 nm, but sorts of lasers to be used are not limited to excimer lasers. For example, He—Cd laser and YAG laser may be used, and the number of lasers is not limited. In addition, a light source usable for the light source section 10 is not limited to lasers. A lamp such as a mercury or xenon lamp may be used singly or in plurality.

The reticle 20 is made, for example, of quartz, which forms a circuit pattern (or an image) to be transferred to the plate 50. The pattern is formed in chromium of a size magnified by the reciprocal times of the projection optical system 30's reduced magnification. In transmitting through the reticle 20, the illumination light L1 from the light source section 10 is diffracted by the pattern and turned into object-side exposure light. The diffracted (or exposure) light from the reticle 20 passes through the projection optical system 30, and projected onto the plate 50. The plate 50 is an object to be exposed, such as a wafer or a liquid crystal plate, and applied a resist 54. The reticle 20 and transparent plate 40 have a conjugate relationship with each other. When the exposure apparatus 1 is a scanning projection exposure apparatus, it scans the reticle 20 and plate 50 to transfer a pattern on the reticle 20 onto the plate 50. When the exposure apparatus 1 is a stepper, i.e., a step-and-repeat exposure apparatus, it exposes while maintaining the reticle 20 and plate 50 in a stationary state.

The projection optical system 30 converts the object-side exposure light that has passed the mask pattern, into an image-side exposure light with sufficiently small aberration, which forms an image of equal or given projection magnifications on the transparent plate 40. The projection optical system 30 may use an optical system that includes only a plurality of lens units, a (catadioptric) optical system including a plurality of lens units and at least one concave mirror, an optical system including a plurality of lens units and at least one diffractive optical device such as a BO (binary optics), and an all-mirror type optical system. A correction of a chromatic aberration may use a plurality of lens units made of glass materials with different dispersion values (or Abbe numbers), or adapt the diffraction optical devices such that it provides a dispersion in a direction opposite to that provided by the lens units. The present embodiment employs the projection optical system 30, and allows reticle 20's pattern to be transferred with a reduced projection magnifications onto the plate 50. In other words, this embodiment does not require the reticle 20's pattern to have such a small width of an opening that the near field light operates (for example, approximately 100 nm or less), and facilitates creation of a large reticle 20 using the current technology.

The transparent plate 40 comprises a base 41, stabilizing layers 42 and 44, and a thin film 43 whose transmittance changes according to an intensity of light of incidence. As is clear from FIG. 1, the thin film 43 is held by the stabilizing layers 42 and 44. The base 41 is made of such a material as has a suitable transmittance for an exposure wavelength, e.g., quartz, fluoric dope quartz, or fluorite, and supports the thin film 43 (through the stabilizing layer 42 in the instant embodiment). The base 41 is of a thickness, e.g., 100 µm to 1,000 µm, strong enough for the thin film 43 to stably exert its performance. The thin film 43 is an optically or thermally active layer which reversibly provides minute an opening in response to light or heat produce, and is preferably made of a phase changing material and a material having a tertiary, highly nonlinear effect, in particular, antimony or an alloyed metal having antimony as its main ingredient. The stabilizing layers 42 and 44 are made, for example, of $Si_3N_4$, thus allows stable phase change of the thin film 43 as well as protecting the thin film 43. Preferably, the thin film 43 and stabilizing layers 42 and 44 contain no oxygen and is made transparent to prevent the optical power to decrease. The transparent plate 40 in the present embodiment is so thick as to be elastically transformable, and elastically adheres to and exfoliates from the plate 50, but it is not necessarily required that the transparent plate 40 be elastically transformable.

The transparent plate 40 is fabricated independently of the plate 50. Due to the fine uneven and undulating surfaces on base 52 and resist 54 in the plate 50, this independent fabrication of the transparent plate 40 is more accurate than a fabrication of the thin film 43 directly onto the resist 54 in the plate 50. As a result, the exposure apparatus 1 may enhance the overlay accuracy, and allows common use of the transparent plate 40 for multiple plates 50, increasing the throughput.

The transparent plate 40 may be fabricated, for example, in a way that quartz, i.e., the base 41, is filmed with $Si_3N_4$ for the stabilizing layers 42 and 44, and then, with Sb for the thin film 43, and a KOH solution is applied to the unfilmed side to do anisotropic etching, thus leaving the stabilizing layers 42 and 44, and the thin film 43 behind.

Figure 2:
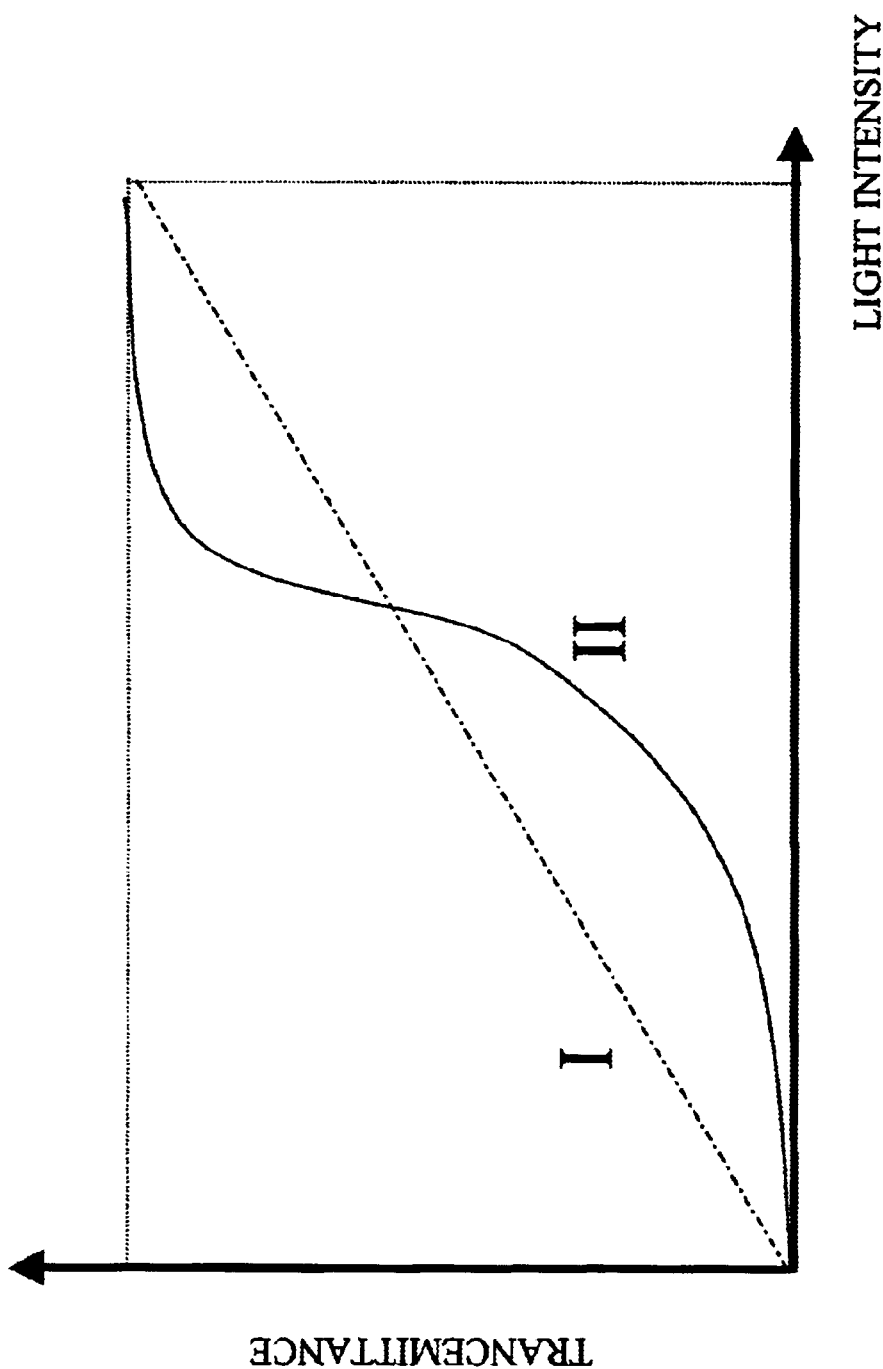
FIG. 2 is a graph showing a relationship between the light intensity and transmittance of the transparent plate used for the exposure apparatus shown in FIG. 1.

FIG. 2 shows graphs of a relationship between the light intensity and transmittance for the transparent plate 40. As illustrated, a (dashed) graph I denotes a characteristic of the thin film 43 that its transmittance increases in proportion to the light intensity, whereas the (solid) graph II denotes a characteristic of the thin film 43 that its transmittance drastically increases at a certain value of the light intensity, reaching saturation.

The plate 50 includes a base 52 such as a wafer and the like, and a photo-resist 54 applied to it. The application step of the resist 54 includes a pretreatment, an adhesion accelerator application treatment, a photo-resist 54 application treatment, and a pre-bake treatment. The pretreatment includes cleaning, drying, etc. The adhesion accelerator application treatment is a surface reforming process so as to enhance the adhesion between the photo-resist 54 and base 52 (i.e., a process to increase the hydrophobicity by applying a surface active agent), through a coat or vaporous process using an organic film such as HMDS (Hexamethyl-disilazane). The pre-bake treatment is a baking (or burning) step, softer than that after development, which removes the solvent.

The base 52 covers a wide range of members, such as a semiconductor substrate made for example of Si, GaAs, and InP, an insulating substrates made for example of glass, quartz and BN, or those formed by forming on these substrates a metal, oxide, and nitride film, but the base 52 should be enough flat to make an interval between the base 52 and the transparent plate 40 throughout the entire exposure area to be at least 100 nm or less, more preferably 10 nm or less.

Similarly, the surface of the resist 54 also needs to be flat. Since the intensity of near field light oozed out of the transparent plate 40 becomes exponentially weak as the distance from the transparent plate 40 increases, it is difficult to expose the resist 54 by 100 nm or longer. Further, the near field light scatteringly spreads in the resist 54 resulting in the wider exposure pattern, the resist 54 should be at least about 100 nm or less in thickness and as thin as possible.

Thus, the material for the resist 54 and its coat method need to be selected such that the film thickness and the unevenness on the resist 54 are at least approx. 100 nm or less, more preferably approximately 10 nm or less. For example, the coat method may dissolve a general-purpose photo-resist material in a solvent that provides a low viscosity, and spin coat the resultant for a thin and uniform thickness. Another example of a photo-resist material and coating method is Langmuir-Blodgett ("LB") method that forms stacked monolayers on the plate by scooping onto the plate a specified number of times a monolayer that is formed by arranging on a water surface amphipathic photo-resist material molecules each of which includes a hydrophobic group, a hydrophilic group, and a functional group in one molecule. Further, a self-assembled monolayer ("SAM") method may be used to form a photo-resist material monolayer onto a plate by the physical absorption or chemical bonding of a monolayer onto the plate in a solvent or a gas. The LB and SAM methods are suitably applicable because they can form extremely thin resist films with a uniform thickness and superior flatness.

A modification of the present embodiment that makes the transparent plate 40 elastically transformable enough to adhere to and exfoliate from the plate 50 may form an anti-adsorptive thin film of about 1–10 nm thickness on an entire surface of the transparent plate 40 opposite to the plate 50, another anti-absorptive thin film of about 1–10 nm thickness on an entire top surface of the resist 54, and make surfaces of these anti-absorptive thin film to have mutually different affinities between the hydrophilic and hydrophobic groups. For example, for a hydrophilic surface of one thin anti-adsorptive thin film, the other uses a hydrophobic surface. A film that exhibits a hydrophobic surface may be made of not only materials, such as long-chain alkyl and trifluoro groups as one or more functional groups that exhibit hydrophobic property in a molecule, with a molecule orientation controlled so that the functional group(s) may face the front surface, but also a water-insoluble high polymer, such as polymethacrylate and polyacrylate derivatives. Conversely, for a hydrophobic surface of one anti-absorptive thin film, the other uses a hydrophilic surface. A film that exhibits a hydrophilic surface may be made of materials, such as carboxyl, sulfuric acid ($SO_3$ —) and amino groups as a functional group that exhibits hydrophilic property in a molecule, with a molecule orientation controlled so that those functional group may face the front surface. These layers do not bond with each other or produce a large absorptive force since no bonding force like hydrogen bonding is produced at a molecular level between these layers. Therefore, it is easy to exfoliate the adhered transparent plate 40 and plate 50 from each other between these anti-adsorptive thin films.

The exposure using the near field light requires a uniform separation of about 100 nm or less between the transparent plate 40 and resist 54/base 52 throughout the entire exposure area at the time of exposure. For this reason, the base 52 is preferably made to be flat by a CMP process.

At the time of exposure, the resist 54 and transparent plate 40 are brought into close contact within such a range that the near field light operates, i.e., from 0 to the wavelength or less of the exposure light L1 emitted from the light source section 12 in the present embodiment. The near field light is a non-propagating light that exists within a wavelength distance from the thin film 43, and drastically drops its intensity as a distance from the thin film 43 increases. Therefore, the resist 54 and the thin film 43 from which the near field light seeps are relatively approached within the distance of the wavelength. For example, when the KrF excimer laser with a wavelength of about 248 nm is used as a light source in the light source section 12, a distance between the transparent plate 40 and plate 50 is preferably set to be a half of the wavelength or about 124 nm or less. Similarly, when the ArF excimer laser with a wavelength of about 193 nm is used as a light source of the light source section 12, a distance between the transparent plate 40 and plate 50 is preferably set to a half of the wavelength or approximately 100 nm or less.

There are some ways of adhering the transparent plate 40 and plate 50 to each other: For example, it is possible to utilize an electrostatic power generation means (not shown) to control the adhesion and exfoliation between the transparent plate 40 and plate 50. The electrostatic power generation means, for example, applies a voltage between the transparent plate 40 and plate 50 to generate the electrostatic power between them. This electrostatic power adheres the transparent plate 40 and plate 50 to each other. A value of the applied voltage may control the adhesion force between the transparent plate 40 and plate 50.

Figures 7A, 7B, 7C:
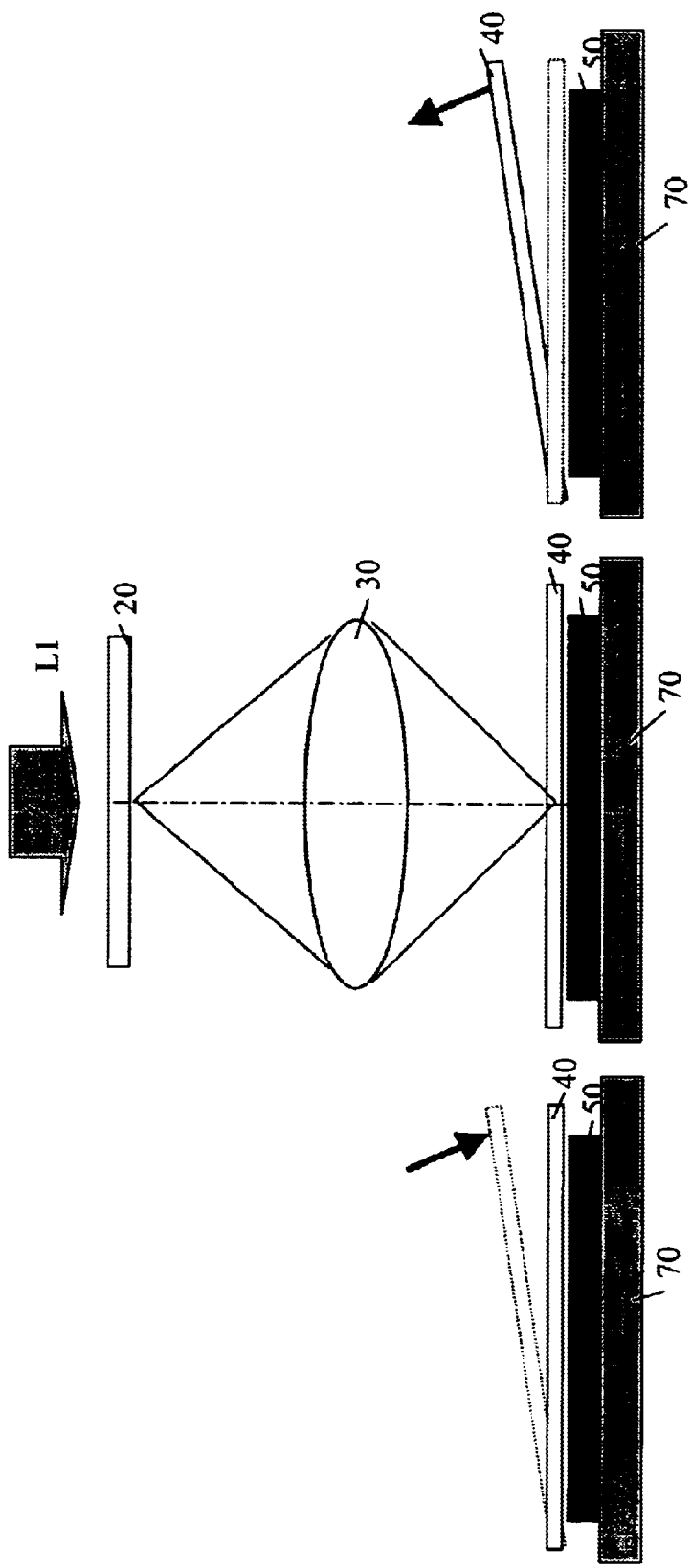
FIG. 7 is another schematic illustration for explaining the connection and disconnection between the transparent plate and the plate shown in FIG. 1.

Before and after the exposure, the transparent plate 40 and the plate 50 are adhered and exfoliated at an adhesion/exfoliation position. The present embodiment moves the transparent plate 40 and plate 50 together between the adhesion/exfoliation position and the exposure position. FIGS. 7(a) and 7(c) show that the transparent plate 40 and the plate 50 are located at the adhesion/exfoliation position, while FIGS. 1 and 7(b) show that the transparent plate 40 and plate 50 are located at the exposure position.

More specifically, before the exposure, the transparent plate 40 is placed, as shown in FIG. 7, on the plate 50 fixed onto a chuck 70, and the transparent plate 40, plate 50, and chuck 70 are transported to the exposure position by a stage (not shown). At a loading position in FIG. 7(a), the transparent plate 40 is set to the plate 50 that has been fixed to the chuck 70. The transparent plate 40 is tilted and kept flat in adhesion to and exfoliation from the plate 50. Here, the transparent plate 40 is preferably made slightly larger than the plate 50 so as to cover its entire surface and project from its peripheral for adhesion and exfoliation purposes. After the exposure of all the shots is completed at the exposure position shown in FIG. 7(b), the transparent plate is moved together with the chuck 70 by the stage (not shown), and exfoliated from the plate 50 at the exfoliation position shown in FIG. 7(c). In FIGS. 7(a) and 7(c), the transparent plate 40 is tilted relative to the plate 50 in adhesion and exfoliation, whereby no air enters between the transparent plate 40 and plate 50. The air between the transparent plate 40 and plate 50 would produce a mixture of adhered and non-adhered portions. The non-adhered portion does not arrange the transparent plate 40 and plate 50 within such a range that the near field light may operate, thus resulting in non-uniform exposure.

Figure 6:
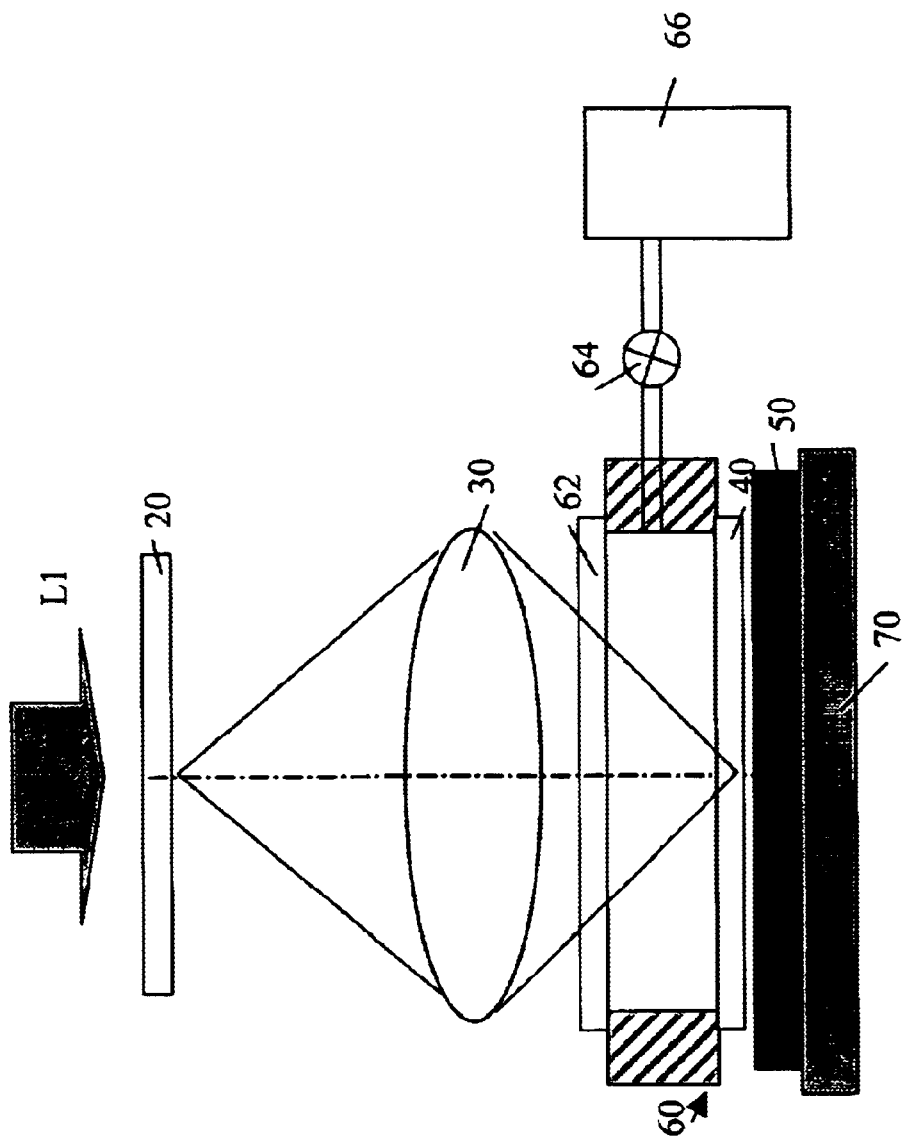
FIG. 6 is a schematic illustration for explaining the connection and disconnection between the transparent plate and the plate shown in FIG. 1.

Alternatively, a pressurizing container 60 shown in FIG. 6 may enhance the adhesion between the transparent plate 40 and plate 50. Here, FIG. 6 is a schematic illustration showing an example of the possible adhesion between the transparent plate 40 and plate 50. If both of the transparent plate 40 and resist 54 have completely flat surfaces, they are adhered to each other over these entire surfaces. However, in reality, due to irregularities and undulations created on the surfaces of the transparent plate 40 and the resist 54/base 52, a mere contact between them would possibly result in a mixture of adhered and non-adhered portions. As stated above, the non-adhered portion does not arrange the transparent plate 40 and plate 50 within such a range that near field light may operate, thus causing non-uniform exposure. Accordingly, the instant embodiment utilizes the pressurizing container 60 to apply the pressure from a rear surface of the transparent plate 40 to its front surface, thereby elastically transforming the transparent plate 40, pressing it against the resist 54, and adheres them to each other over the entire surfaces. The inverse pressure applies in exfoliating the transparent plate 40 from the plate 50.

The pressurizing container 60 controls a difference of pressure between the incidence and exit sides of the transparent plate 40 and includes a glass-made transparent plate (or light transmission window) 62 at its top to block off gas, and the transparent plate 40 at its bottom. The pressurizing container 60 is connected to a high-pressure gas container 66 through a regulating valve 64, and configured to have a controllable inner pressure. As described above, the plate 50 is fixed to the chuck 70, and the chuck 70 is fixed to the stage not shown.

The plate 50 is aligned with the reticle 20 by an alignment optical system (not shown). Next, the regulating valve 64 is opened to lead gas from the high-pressure container 66 to the pressurizing container 60, and then closed after the pressure in the pressurizing container 60 has been enhanced. The elastically transformable transparent plate 40 is thereby pressed against the plate 50, and the transparent plate 40 and resist 54 in the plate 50 are sufficiently adhered to each other by uniform pressure over the entire surfaces. A pressure application according to this method produces a uniform repulsive force generated between the transparent plate 40 and resist 54 under the Pascal's law; the transparent plate 40 and resist 54 receive no large force locally or get damaged locally.

The adhesion between the transparent plate 40 and plate 50 is adjusted by regulating the pressure in the pressurizing container 60. For the relatively large unevenness and undulation on the surface of the transparent plate 40 opposite to the plate 50, and on the surfaces of the surfaces of the resist 54 and base 52, the pressure in the pressurizing container 60 is set slightly higher to increase an adhesion force, and provide a constant interval between the transparent plate 40 and plate 50.

Alternatively, the front side of the transparent plate 40 and the side of the resist 54 may be arranged in a depressurizing container. This arrangement utilizes a difference of pressure from the higher outside air pressure to apply pressure from the rear side of the transparent plate 40 to the front side, and enhances the adhesion between the transparent plate 40 and resist 54. In any event, a difference of pressure is so created that the pressure at the rear side of the transparent plate 40 may become higher than that at its front side. For the relatively large unevenness and undulation on the surface of the transparent plate 40 opposite to the plate 50, and on the surfaces of the surfaces of the resist 54 and base 52, the pressure in the depressurizing container is set slightly lower to increase the adhesion force, and provide a constant interval between the transparent plate 40 and plate 50.

The exposure is performed in this state. After the exposure, a regulating valve (not shown) is opened, the pressurizing container 60 is evacuated through an exhaust pump (not shown) to lower the pressure in the pressurizing container 60, and the transparent plate 40 is separated (or exfoliated) from the plate 50 by elastic transformation. A pressure decreased according to this method produces a uniform repulsive force generated between the transparent plate 40 and resist 54 under Pascal's law; the transparent plate 40 and resist 54 receive no large force locally or get damaged locally.

The stage (not shown) then moves to collect the plate 50 and to set the next plate 50 similarly for exposure purposes. The embodiment shown in FIG. 6, unlike FIG. 7, fixes the transparent plate 40 at the exposure position, and moves only the plate 50 and chuck 70 between the adhesion/exfoliation position and the exposure position.

Still another embodiment replaces the high-pressure gas container 66 with a container filled with a liquid that is transparent to the light L1, and uses a cylinder to adjust the pressure of the liquid inside the container.

Figure 8:
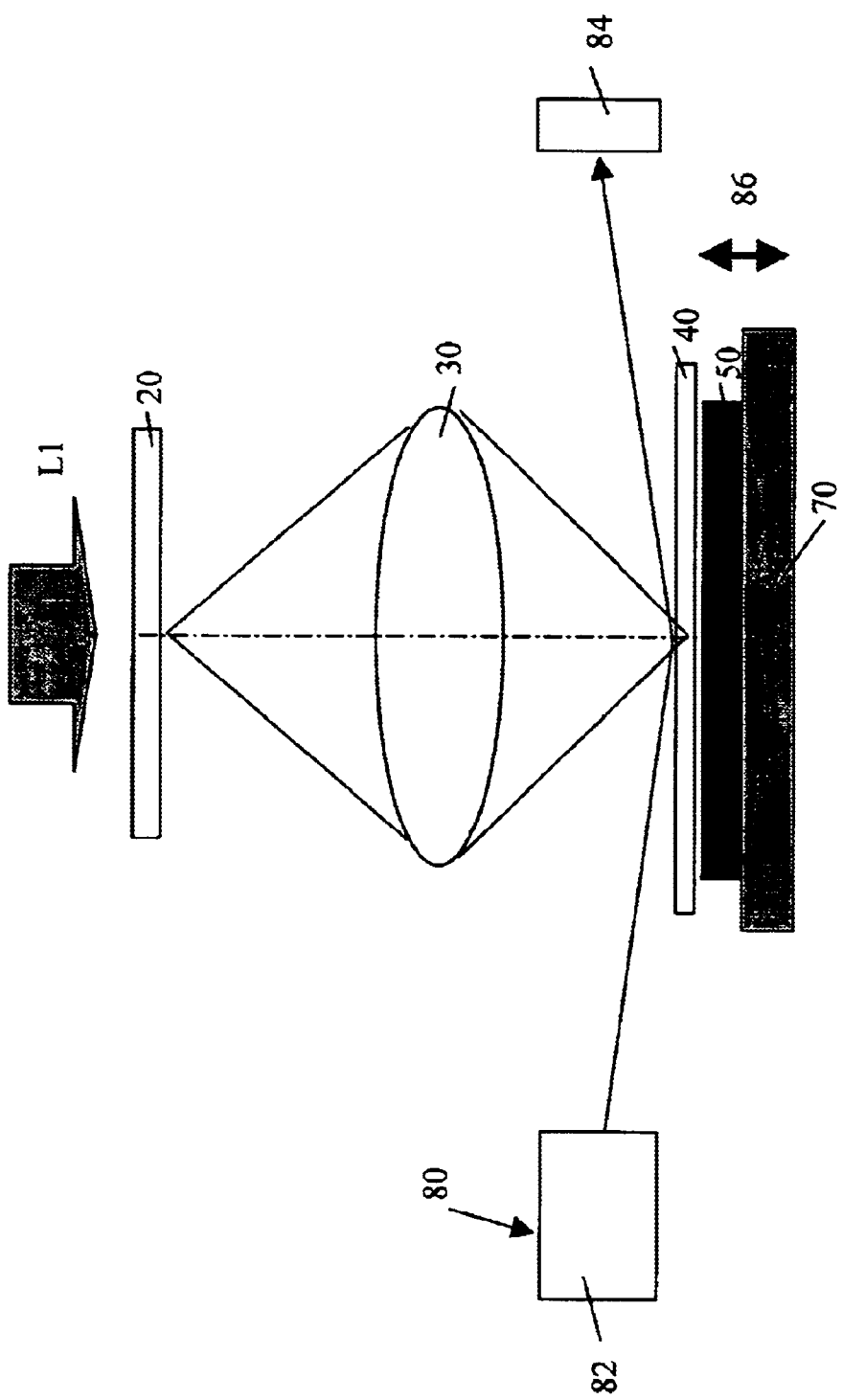
FIG. 8 is a schematic illustration showing an auto-focus optical system that detects the focus position of the plate of the exposure apparatus shown in FIG. 1.

FIG. 8 shows an auto-focus (AF) optical system 80 that detects the focal point for the plate 50. The AF optical system 80 includes a controller 81 (not shown), a projection system (or a light emitter) 82 for projecting a spot- or sheet-shaped measurement beam (or non-exposure light that does not expose the resist 54) onto the transparent plate 40, a detecting system 84 for detecting light reflected from the transparent plate 40, and a transport mechanism 86 for tilting and moving up and down the stage (not shown) for supporting the chuck 70.

The controller 81 (or a memory (not shown) connected to the controller 81) has previously stored information on the best focal point for the projection optical system 30. The projection system 82 projects a plurality of beams to check for the slant in the plane of the transparent plate 40. The detecting system 84 includes a plurality of position-detecting light receiving elements corresponding to the beams, and the projection optical system 30 approximately conjugates a light receiving plane of each position-detecting light receiving element with a reflection point of each beam on the transparent plate 40. A shift of the transparent plate 40 in an optical-axis direction is measured as a displacement of an incident beam on the position-detecting light receiving element in the detecting system 84. As a result, the controller 81 can calculate a shift to a focus direction (or the optical-axis direction) from the focus reference position of the transparent plate 40 measured by the detecting system 84. The controller 81 corrects a focus and tilt based on the detection signals from the detecting system 84. More concretely, the controller 81 corrects the focus and tilt by controlling driving of the transport mechanism 86 for tilting and moving up and down the chuck 70. AF correction may directly adjust a condensing point of a beam on the detecting system 84, or change the focal distance of the projection optical system 30. A focal-point detecting means may adopt a method for measuring the air pressure and a capacitance sensor as well as an optical method.

Figure 9:
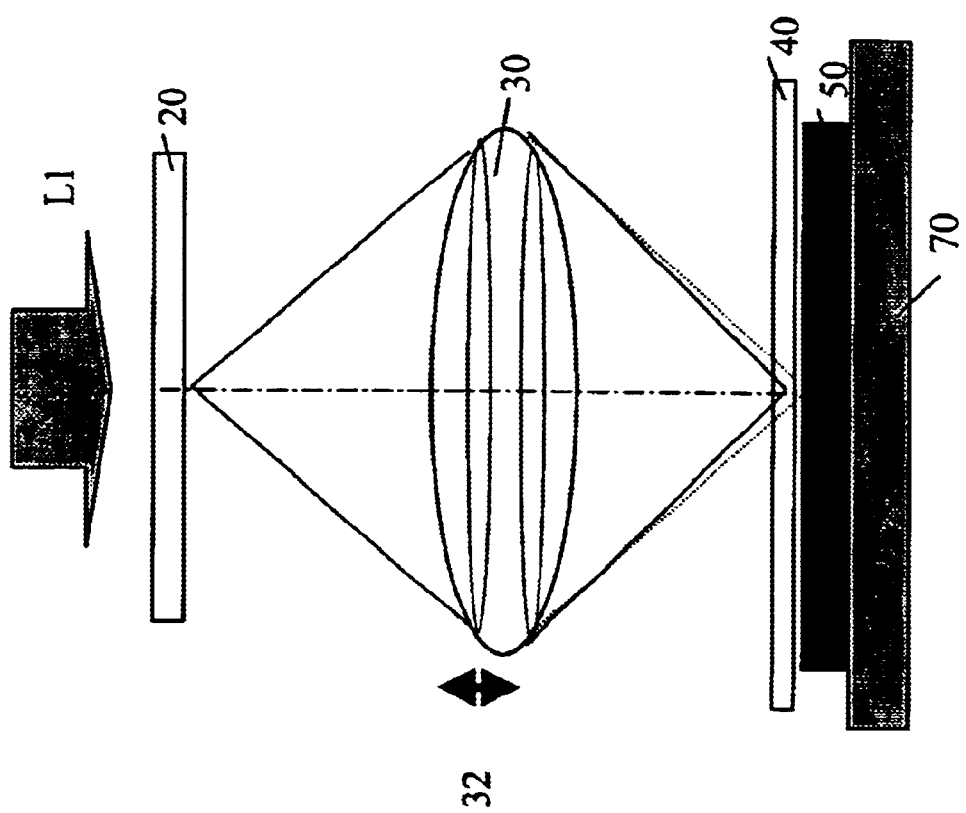
FIG. 9 is a schematic illustration showing a mechanism for adjusting a separation between the lenses in the projection optical system to correct a spherical aberration produced by the transparent plate installed in the exposure apparatus shown in FIG. 1.

FIG. 9 shows a mechanism 32 for adjusting a separation between lenses in the projection optical system 30 to correct a spherical aberration produced as a result of introduction of the transparent plate 40 as a transparent plane parallel plate. Other various types of aberrational corrections are corrected by inserting corrective optical members and driving corrective optical devices.

Figure 10:
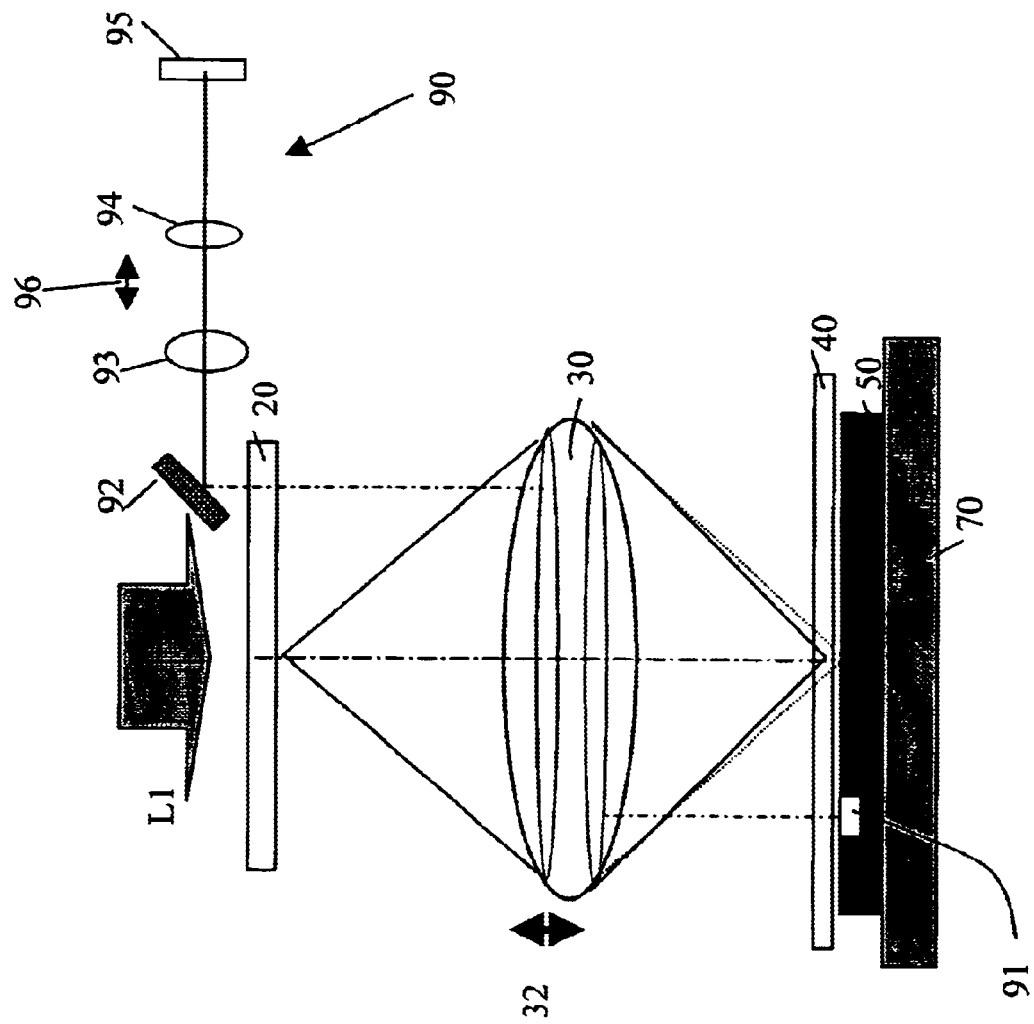
FIG. 10 is a schematic illustration showing an alignment optical system that uses an alignment mark on the plate for the TTL alignment for the plate in the exposure apparatus shown in FIG. 1.

FIG. 10 shows an alignment optical system 90 which uses an alignment mark 16 created on the plate 50 for a TTL (through-the-lens) alignment for the plate 50. The alignment optical system 90 includes lenses 93 and 94, and a detector 95 through the projection optical system 30. Here, an aberration produced by the inserted transparent plate 40 is corrected by a drive mechanism 96 for driving the lens 93 and/or 94.

During the exposure, a light beam emitted from the light source section 10 illuminates the reticle 20, and the projection optical system 30 then projects a pattern on the reticle 20 onto the transparent plate 40 with reduced magnifications. The projection optical system 30 forms a pattern image L2 on the reticle 20 onto the thin film 43 in the transparent plate 40, causes a phase change in the thin film 43 according to the intensity distribution, and generates a minute light intensity distribution L3 inside the thin film 43. The light intensity distribution L3 turns into a near field light L4, which oozes from the thin film 43, arrives at the stabilizing layer 44 and the resist 54, and exposes the resist 54 with the light intensity distribution in accordance with the transmittance distribution. As described later, an adequately set threshold for the resist 54 would form a minute resist pattern onto the plate 50. A description will now be given, with reference to FIG. 3, of how the near field light transfers a minute pattern on the reticle 20 onto the plate 50.

FIG. 3(*a*) is a graph that shows a light intensity distribution created on the plate 50 when an exposure apparatus with no transparent plate 40 has projected onto the plate 50 a pattern on the reticle 20 which has a line width thinner than the resolution. As is understood from FIG. 3(*a*), the light intensity distribution is a blurred and expanded distribution.

FIG. 3(*b*) shows the light intensity distribution L3 (see FIG. 1) of light that has just passed through the thin film 43 when the transparent plate 40 is used. Here, a dotted line in FIG. 3(*b*) corresponds to the light intensity distribution for light that has passed through the thin film 43 having the constant transmittance, as is similar to no thin film 43. A dashed line in FIG. 3(b) corresponds to the light intensity distribution for light that has passed through the thin film 43 having the transmittance characteristic (or dashed line) I in FIG. 2. A solid line in FIG. 3(b) corresponds to the light intensity distribution for light that has passed through the thin film 43 having a transmittance characteristic (or solid line) II in FIG. 2. The light intensity distributions just after through the thin film 43 become steeper, as shown by the solid and dashed lines in FIG. 3(b) than the dotted line that corresponds to no thin film 43.

If the resist 54 responsive to the threshold shown in FIG. 3(b) or higher is exposed to each of the light intensity distributions illustrated by the dotted, dashed, and solid lines in FIG. 3(b), only part in the resist 54 which corresponds to the threshold or higher will be left behind by a subsequent development process, thus providing a pattern of a line width shown by each of the dotted, dashed and solid lines in FIG. 3(c).

Therefore, it will be understood that the thin film 43's transmittance characteristic, the optical quantity of exposure light, and the threshold for the resist 54 are preferably determined such that the thus formed line width of the resist 54 become a desirable resolution. FIG. 3 shows a negative resist in which only illuminated part is left behind, but a positive resist may be also used to provide a pattern in which left part and removed part in the resist are inversed.

FIG. 4(a) shows that the simultaneous exposure to a wider mask pattern (at a left side) and a thicker mask pattern (at a right side) than a resolution of an exposure apparatus 1 having no transparent plate 40. The minute mask pattern at the left side thinner than the resolution $R=k_1$ ($\lambda$/NA) of the projection optical system provides, as in FIG. 3, a blurred and expanded distribution with a low peak intensity. On the other hand, the wider mask pattern at the right side than the resolution of the projection optical system does not provide a blurred and nearly constant light intensity distribution with a high light intensity. Accordingly, without the transparent plate 40, an optical transfer could not expose a minute mask pattern as in the prior art. Accordingly, as shown in FIGS. 4(b) and 4(c), the present embodiment provides the thin film 43 whose transmittance changes according to the light intensity, and equalizes the two transmitting light intensity distributions in the maximum immediately after the thin film 43. As a result, the proper resist's threshold level setting may expose a pattern of a desired size.

FIG. 5 is an example of a dual gate pattern that includes a thick pattern and a minute pattern. FIG. 5(a) is a conventional pattern having a gate part within the resolution limits of the projection optical system, but the inventive exposure method and apparatus may form both gate parts in FIGS. 5(a) and 5(b). Since the line width of the gate part determines device's speed, it is possible to create a device having a fast operation speed. In this way, the near field light serves to transfer a pattern onto a resist 54 with high accuracy, and thus the inventive exposure method and apparatus may provide high quality devices (such as semiconductor devices, LCD devices, image pick-up devices (e.g., a CCD), and thin film magnetic heads).

Figure 11:
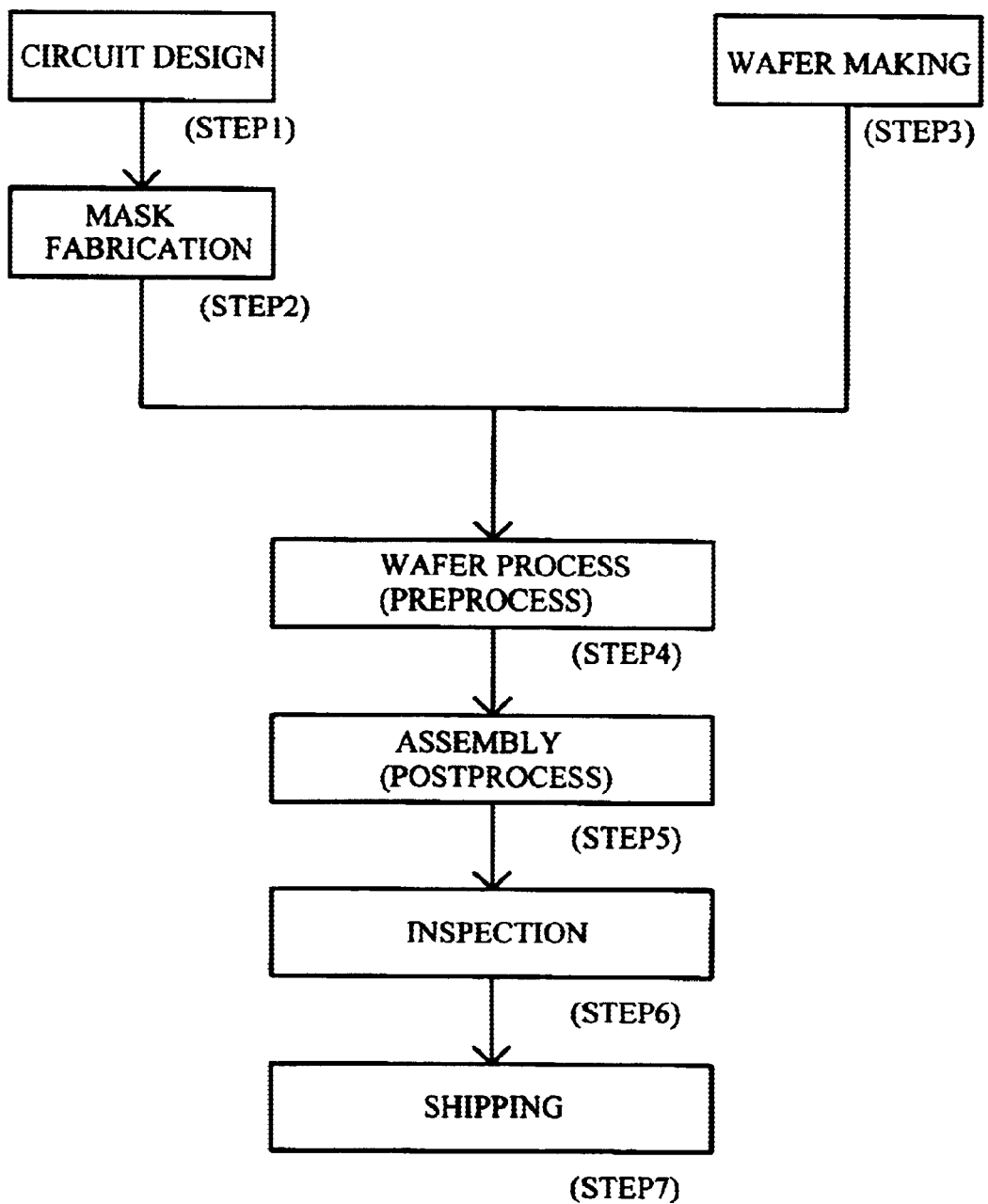
FIG. 11 is a flowchart for explaining a device fabricating method including the exposing step of the present invention.
Figure 12:
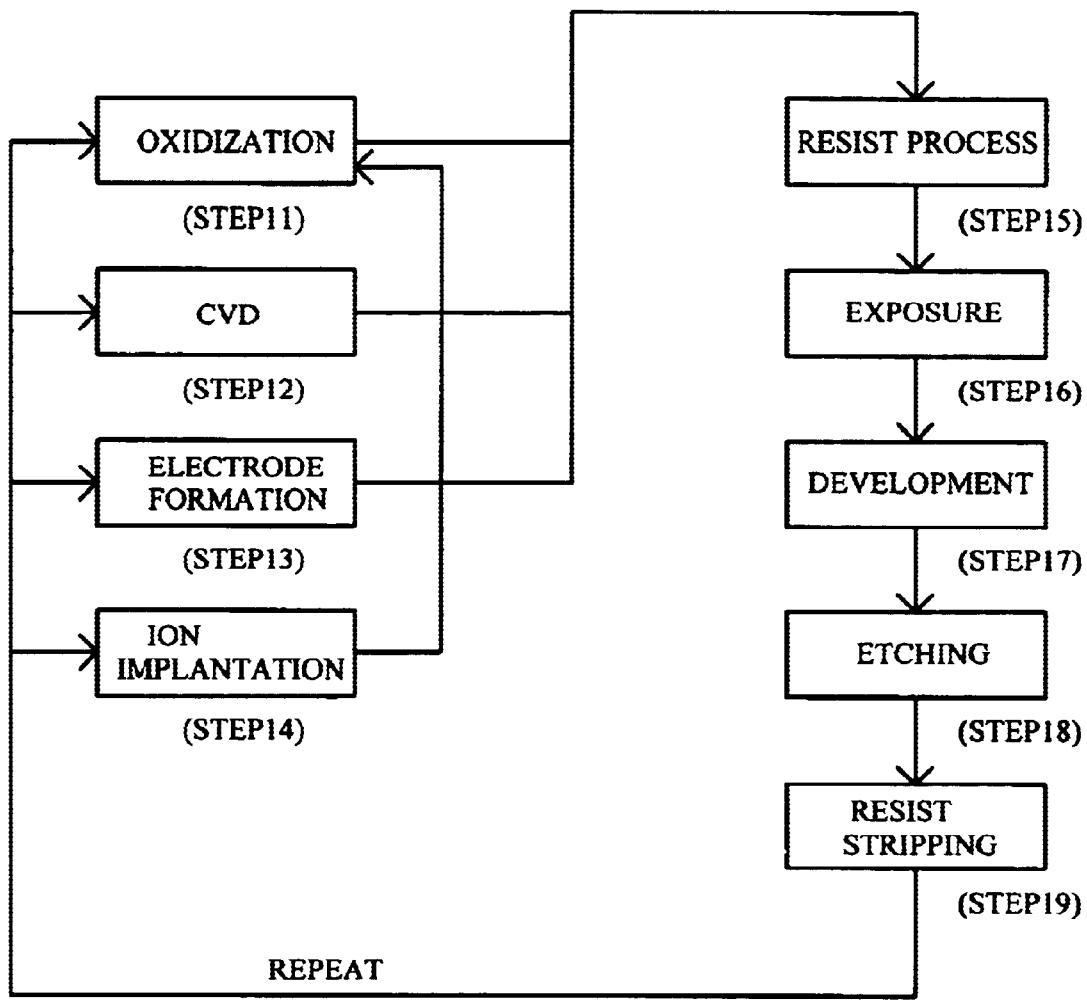
FIG. 12 is a detailed flowchart for step 4 shown in FIG. 11.
Figure 13:
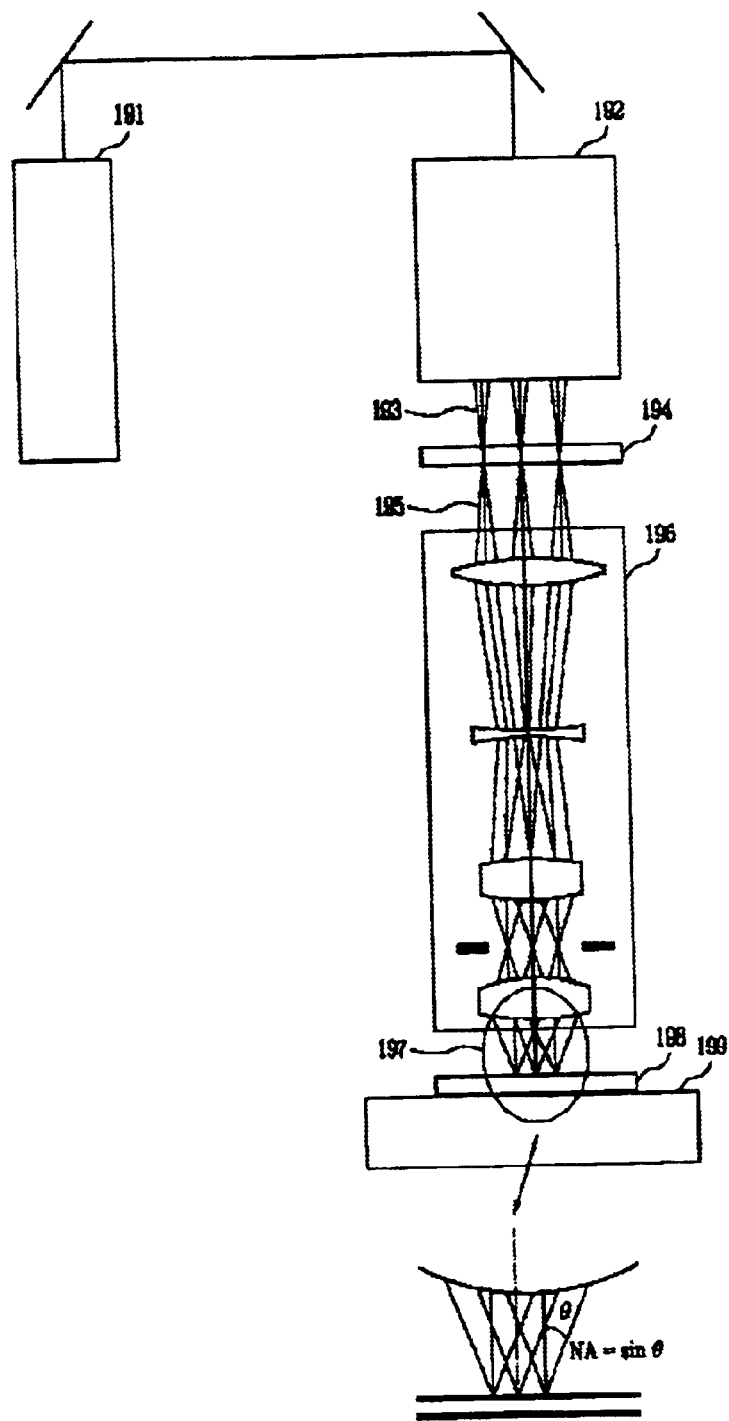
FIG. 13 is a schematic cross-section for explaining a conventional exposure apparatus.

With reference to FIG. 11 and FIG. 12, a description will now be given of a device fabricating method utilizing the exposure apparatus 1. FIG. 11 is a flowchart to explain a fabrication process of devices (e.g., semiconductor chips such as an IC and LSI, LCDs, CCDs, and the like). Here, a description is given exemplarily of a fabrication of semiconductor chips. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through photolithography using the mask and wafer. Step 5 (assembly), which is also referred to as a posttreatment, forms into a semiconductor chip the ware formed in step 4 and includes a assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 12 is a detailed flowchart of the wafer process in Step 4. Step 11 (oxidation) oxidizes wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 1 to expose a circuit pattern on the mask onto the wafer. Step 17 (development) develops the exposed wafer. Step 18 (etching) etches part other than a developed resist image. Step 19 (resist stripping) removes disused resist after etching. These steps are repeated, and multi-layer circuit patterns are formed on the wafer. The fabrication method of the instant embodiment may manufacture higher quality devices than the prior art.

Further, the present invention is not limited to these preferred embodiments, and various variations and modifications may be made without departing from the spirit and scope of the present invention.

The aforementioned exposure method and apparatus thus utilize the near field light and exposes an object with a high resolution. In addition, such an exposure method and apparatus employs a transparent plate as a member independent of the object, and form a thin film with a higher accuracy than forming a thin film directly onto the object possibly having irregularities and undulations, thereby increasing the overlay accuracy. Further, such an exposure method and apparatus can enhance a throughput because they commonly use the near-field-light generating transparent plate for a plurality of objects. Such an exposure method and apparatus use a projection optical system, transfer a mask pattern onto a thin film with equal and reduced magnifications, and enables the current technology to use an opening width wider than a mask pattern for the equal magnification to form a large mask. The device fabricating method with the enhanced exposure resolution and overlay accuracy may provide high-quality devices such as semiconductors, LCDs, CCDs, and thin film magnetic heads.

As described above, the present invention can enhance a throughput in the exposure step using the near field light.

What is claimed is:

1. An exposure method comprising the steps of:
   arranging an object to be exposed and a transparent plate that includes a thin film, within such a range that near field light from the thin film may operate on the object, the thin film having a light transmittance that changes according to an intensity of light of incidence; and
   exposing the object with near field light generated by projecting a pattern on a mask, onto the thin film of the transparent plate.

2. An exposure method according to claim 1, wherein said arranging and exposing steps use a step-and-repeat projection exposure apparatus.

3. An exposure method according to claim 1, wherein said arranging and exposing steps use a step-and-scan projection exposure apparatus.

4. An exposure method according to claim 1, wherein the thin film is composed of a phase transition material.

5. An exposure method according to claim 1, wherein the thin film is held by stabilizing layers for stabilizing fluctuations in the light transmittance of the thin film and for protecting the thin film.

6. An exposure method according to claim 1, wherein a distance between the transparent plate and object is set from zero to a wavelength of the near field light.

7. An exposure method according to claim 1, wherein the light of incidence is selected from ultraviolet and soft X rays.

8. An exposure method according to claim 1, wherein the object includes a wafer and a resist applied onto the wafer.

9. An exposure method according to claim 8, further comprising the step of holding the wafer on a wafer chuck while the transparent plate and wafer are arranged within such a range that the near field light operates on the wafer, and said exposing step performs a projection exposure for the object.

10. An exposure method according to claim 1, wherein said arranging step covers a whole surface of the object with the thin film.

11. An exposure method according to claim 1, further comprising the step of exfoliating the thin film from the object after said exposing step.

12. An exposure method according to claim 1, further comprising the step of utilizing reflected light from a surface of the transparent plate to detect an exposure position for the object.

13. An exposure method according to claim 1, wherein the object includes an alignment mark, said method further comprising the step of aligning the object using the alignment mark as well as correcting an aberration.

14. An exposure method according to claim 1, wherein the mask includes a first pattern with a first line width and a second pattern with a second line width which is thinner than the first line width, and said exposing step exposes the second pattern with the near field light.

15. An exposure method according to claim 1, further comprising the step of correcting an aberration produced during the projecting due to a thickness of the transparent plate.

16. An exposure method according to claim 15, wherein said correcting step changes separations among multiple lenses for projecting the pattern onto the object.

17. An exposure apparatus comprising:
   a transparent plate arranged within such a range that near field light from said transparent plate may operate on an object to be exposed, said transparent plate including a thin film whose light transmittance changes according to an intensity of light of incidence; and
   a projection optical system for projecting a pattern on a mask onto the thin film of the transparent plate and for exposing the object with the near field light generated by the projection.

18. An exposure apparatus according to claim 17, wherein said exposure apparatus is a step-and-repeat projection apparatus.

19. An exposure apparatus according to claim 17, wherein said exposure apparatus is a step-and-scan projection apparatus.

20. An exposure apparatus according to claim 17, wherein the thin film is composed of a phase transition material.

21. An exposure apparatus according to claim 17, further comprising a stabilizing layer for stabilizing fluctuations in the light transmittance of the thin film as well as protects the thin film.

22. An exposure apparatus according to claim 17, wherein a distance between the transparent plate and the object is set from zero to a wavelength of the light of incidence.

23. An exposure apparatus according to claim 17, wherein the light of incidence is selected from ultraviolet and soft X rays.

24. An exposure apparatus according to claim 17, wherein the object includes a wafer and a resist applied to the wafer.

25. An exposure apparatus according to claim 24, further comprising a wafer chuck for holding the wafer so that said projection optical system may performs a projection exposure for the object while said transparent plate and the wafer are located close to each other.

26. An exposure apparatus according to claim 17, wherein the thin film covers a whole surface of the object.

27. An exposure apparatus according to claim 17, further comprising a mechanism for arranging said transparent plate and the object within the range before the object is exposed, and for exfoliating said transparent plate and the object from each other after the object is exposed.

28. An exposure apparatus according to claim 17, further comprising an exposure position detecting system which utilizes reflected light from a surface of said transparent plate to detect an exposure position of the object.

29. An exposure apparatus according to claim 17, wherein the object includes an alignment mark, and said apparatus further comprises a corrector for aligning the object based on the alignment mark and corrects an aberration.

30. An exposure apparatus according to claim 17, wherein the mask includes a first pattern with a first line width and a second pattern with a second line width which is thinner than the first line width, and said projection optical system exposes the second pattern using the near field light.

31. An exposure apparatus according to claim 17, further comprising a correction device for correcting an aberration resulted from a thickness of the transparent plate.

32. An exposure apparatus according to claim 31, wherein said projection optical system includes a plurality of lenses, and said correction device includes a mechanism for changing a separation between the lenses.

33. A device fabricating method using an exposure apparatus comprising a transparent plate arranged within such a range that near field light from the transparent plate may operate on an object to be exposed, the transparent plate including a thin film whose light transmittance changes according to an intensity of light of incidence, and a projection optical system for projecting a pattern on a mask onto the thin film in the transparent plate and exposes the object with near field light generated by said projection, said method comprising the steps of:
   exposing the object using the exposure apparatus; and
   performing a predetermined process for the object exposed.

34. A device fabricated from an object exposed by using an exposure apparatus comprising a transparent plate arranged an object to be exposed within such a range that near field light from the transparent plate may operate on the object, the transparent plate including a thin film whose light transmittance changes according to an intensity of light of incidence, and a projection optical system for projecting a pattern on a mask onto the thin film of the transparent plate and for exposing the object with the near field light generated by the projection.

* * * * *